United States Patent
Trotman et al.

(10) Patent No.: US 11,839,061 B2
(45) Date of Patent: Dec. 5, 2023

(54) HEAT TRANSFER INTERFACES FOR CIRCUIT CARD ASSEMBLY (CCA) MODULES

(71) Applicant: Hamilton Sundstrand Corporation, Charlotte, NC (US)

(72) Inventors: Alexander Trotman, South Windsor, CT (US); Judy Schwartz, Longmeadow, MA (US); Josh Kamp, Glastonbury, CT (US); Robert J. DeFelice, South Windsor, CT (US); Michael Doe, Jr., Southwick, MA (US); Anthony Matthew DeLugan, Westfield, MA (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 0 days.

(21) Appl. No.: 17/728,653

(22) Filed: Apr. 25, 2022

(65) Prior Publication Data

US 2023/0345676 A1    Oct. 26, 2023

(51) Int. Cl.
*H05K 7/20* (2006.01)
*H05K 7/14* (2006.01)

(52) U.S. Cl.
CPC ....... *H05K 7/20636* (2013.01); *H05K 7/1404* (2013.01); *H05K 7/1461* (2013.01); *H05K 7/205* (2013.01)

(58) Field of Classification Search
CPC ............ H05K 7/20636; H05K 7/1404; H05K 7/1461; H05K 7/205
USPC ....................................................... 361/688
See application file for complete search history.

(56) References Cited

U.S. PATENT DOCUMENTS

| | | |
|---|---|---|
| 3,865,183 A | 2/1975 | Roush |
| 3,904,933 A | 9/1975 | Davis |
| 6,141,211 A | 10/2000 | Strickler et al. |
| 6,796,372 B2 * | 9/2004 | Bear ................ F28F 13/00 165/185 |
| 9,967,978 B1 | 5/2018 | Eiermann et al. |
| 10,426,054 B1 * | 9/2019 | Trotman ............ H05K 7/1402 |
| 2007/0297136 A1 | 12/2007 | Konshak |
| 2010/0321890 A1 * | 12/2010 | Streyel ............ H05K 7/20545 361/704 |
| 2012/0020017 A1 * | 1/2012 | Kehret ................ G06F 1/183 361/679.54 |

(Continued)

OTHER PUBLICATIONS

Extended European Search Report dated Sep. 13, 2023, issued during the prosecution of European Patent Application No. EP23169812. 7.

*Primary Examiner* — Anatoly Vortman
*Assistant Examiner* — Zhengfu J Feng
(74) *Attorney, Agent, or Firm* — Locke Lord LLP; Joshua L. Jones; Scott D. Wofsy

(57) ABSTRACT

An electronic module assembly includes a circuit card assembly (CCA) with heat generating electronic components. A connector is electrically connected to the heat generating electronic components, wherein the connector is positioned at a connection end of the CCA. A heatsink is mounted to the CCA, connected in thermal communication with the electronic components. An undulating channel feature is defined along a lateral edge of the heatsink relative to the connector. One or more channels of the undulating channel feature are aligned with an insertion axis defined by the connector.

14 Claims, 4 Drawing Sheets

(56) References Cited

U.S. PATENT DOCUMENTS

2012/0063084 A1* 3/2012 Fowler ................. H05K 7/1418
361/699
2012/0170224 A1* 7/2012 Fowler ............... H05K 7/20545
361/720

* cited by examiner

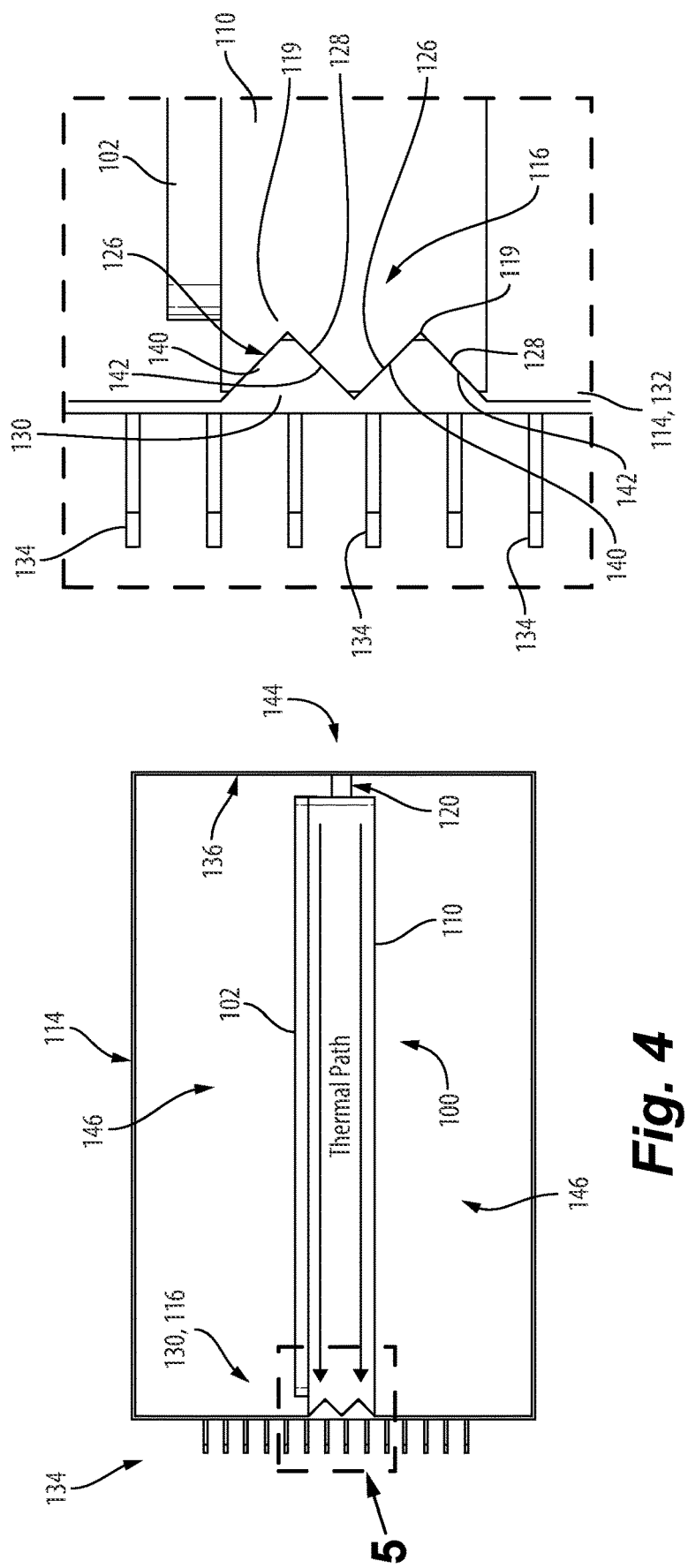

HEAT TRANSFER INTERFACES FOR CIRCUIT CARD ASSEMBLY (CCA) MODULES

BACKGROUND

1. Field

The present disclosure relates to heat transfer in electronic devices, and more particularly to heat transfer interfaces for circuit card assemblies (CCAs).

2. Description of Related Art

As the electronics industry pushes towards modularity, replaceable card-guide CCA (circuit card assembly) designs are becoming increasingly common. With this modularity comes the need for modules to be quickly installed and removed. Traditional methods of CCA retention (e.g. wedge locks) in modular designs provide very little resultant surface area for heat transfer once tightened in place. This provides challenges for thermal management as demand for the power dissipation of CCA designs is growing.

The conventional techniques have been considered satisfactory for their intended purpose. However, there is an ever present need for improved systems and methods for improved heat transfer from CCAs. This disclosure provides a solution for this need.

SUMMARY

An electronic module assembly includes a circuit card assembly (CCA) with heat generating electronic components. A connector is electrically connected to the heat generating electronic components, wherein the connector is positioned at a connection end of the CCA. A heatsink is mounted to the CCA, connected in thermal communication with the electronic components. An undulating channel feature is defined along a lateral edge of the heatsink relative to the connector. One or more channels of the undulating channel feature are aligned with an insertion axis defined by the connector.

The undulating channel feature can include at least two undulating channels. The heatsink can include a wedge lock extending along a lateral edge of the heatsink opposite the undulating channel feature. The undulating channel feature can extend along the full length of the lateral edge of the heatsink. Each channel of the undulating channel feature can be defined between two wedge surfaces, wherein each wedge surface is parallel relative to the insertion axis. Each wedge surface can be oblique relative to a plane defined by the CCA.

The assembly can include a chassis. A rail feature can be defined on an inward facing surface of the chassis. The connector can be connected to a corresponding electrical interface in the chassis with the undulating channel feature engaged with the rail feature to house the CCA and heatsink within the chassis.

Opposed wedge surfaces of the undulating channel feature can be engaged in thermal contact with corresponding surfaces of the rail feature for sinking heat from the heat generating electronic components to the chassis. The undulating channel feature and rail feature can be configured to guide the connector to connect with the electrical interface of the chassis as the CCA is inserted into the chassis. At least one additional connector can be aligned with the first connector for connecting independent functions of the CCA to an electrical interface of a chassis.

The CCA can occupy a first bay of the chassis, wherein the chassis includes a second bay with wedge locks configured for retaining a wedge locking CCA in the chassis. The chassis can include a bay with a second rail feature configured for retaining a second CCA with a corresponding undulating channel feature. The CCA can occupy a bay of the chassis that is configured to receive CCA modules complying with one of 3U, 6U, 9U, and VITA-compliant module envelopes.

The heatsink can include a wedge lock extending along a lateral edge of the heatsink opposite the first wedge feature. The chassis can include a wedge lock surface of the chassis opposite the first rail feature. The wedge lock can be compressed against the wedge lock surface of the chassis. The connector, electrical interface, undulating channel feature, rail feature, and wedge lock can be configured to retain the CCA in place within the chassis. Heat sink fins can be defined on an outside surface of the chassis in thermal communication with the rail feature for conducting heat away from the rail feature.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein:

FIG. 4 is a schematic plan view of the assembly of FIG. 2, showing a thermal path through the heat sink to the chassis; and FIG. 5 is a schematic plan view of the assembly of FIG. 4, showing the interface between the heat sink and the chassis, with external heat exchange fins on the chassis.

DETAILED DESCRIPTION OF THE PREFERRED EMBODIMENTS

Figure 1:
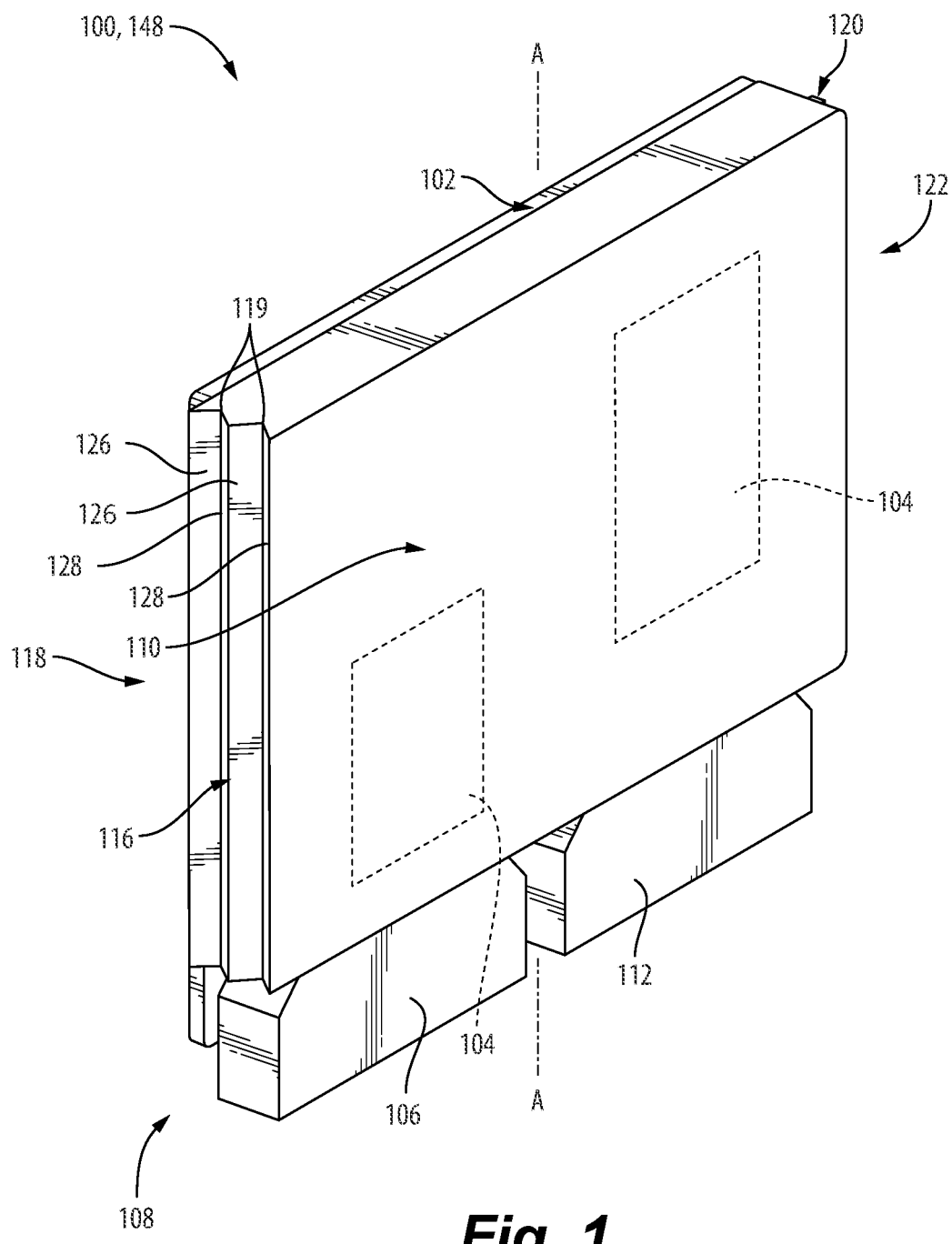
FIG. 1 is a schematic perspective view of an embodiment of an assembly constructed in accordance with the present disclosure, showing the circuit card assembly (CCA), connectors, and heatsink with an undulating channel feature.

Reference will now be made to the drawings wherein like reference numerals identify similar structural features or aspects of the subject disclosure. For purposes of explanation and illustration, and not limitation, a partial view of an embodiment of an electronic module assembly in accordance with the disclosure is shown in FIG. 1 and is designated generally by reference character 100. Other embodiments of systems in accordance with the disclosure, or aspects thereof, are provided in FIGS. 2-5, as will be described. The systems and methods described herein can be used to improve heat sinking from heat generating components of circuit card assemblies (CCAs) relative to conventional wedge locks.

The electronic module assembly 100 includes a circuit card assembly (CCA) 102 including heat generating electronic components 104. A first connector 106 is electrically connected to the heat generating electronic components 104. The connector 106 is positioned at a connection end 108 of the CCA 102. A heatsink 110 is mounted to the CCA 102 and is connected in thermal communication with the electronic components 104. At least one additional connector 112 is aligned with the first connector 106, e.g., for connecting independent functions or modules of the CCA 102 to an electrical interface 138 of a chassis 114, which shown and described below with reference to FIG. 2-3. Those skilled in the art will readily appreciate that any suitable number of connectors 108, 112 can be used, including one, without departing from the scope of this disclosure.

With continued reference to FIG. 1, an undulating channel feature 116 is defined along a lateral edge 118 of the heatsink relative to the connector 106. The heatsink 110 includes a wedge lock 120 feature extending along the opposite lateral edge 122 of the heatsink 110 opposite the undulating channel feature 116. The undulating channel feature 116 includes two undulating channels 119, however those skilled in the art having the benefit of this disclosure will readily appreciate that any suitable number of undulating channels 119, including one, can be included without departing from the scope of this disclosure. The undulating channel feature 116 extends along the full length of the lateral edge 118 of the heatsink 110, although it can also extend less than the full length without departing from the scope of this disclosure. Moreover, those skilled in the art will readily appreciate that the undulating channel feature 116 can be on the opposite edge 122 of the heat sink 110 without departing from the scope of this disclosure. Each channel 119 of the undulating channel feature 116 is defined between two respective wedge surfaces 126, 128, wherein the channels 119 and each wedge surface 126, 128 run parallel relative to the insertion axis A. Each wedge surface 126, 128 is oblique relative to the plane defined by the CCA.

Figure 2:
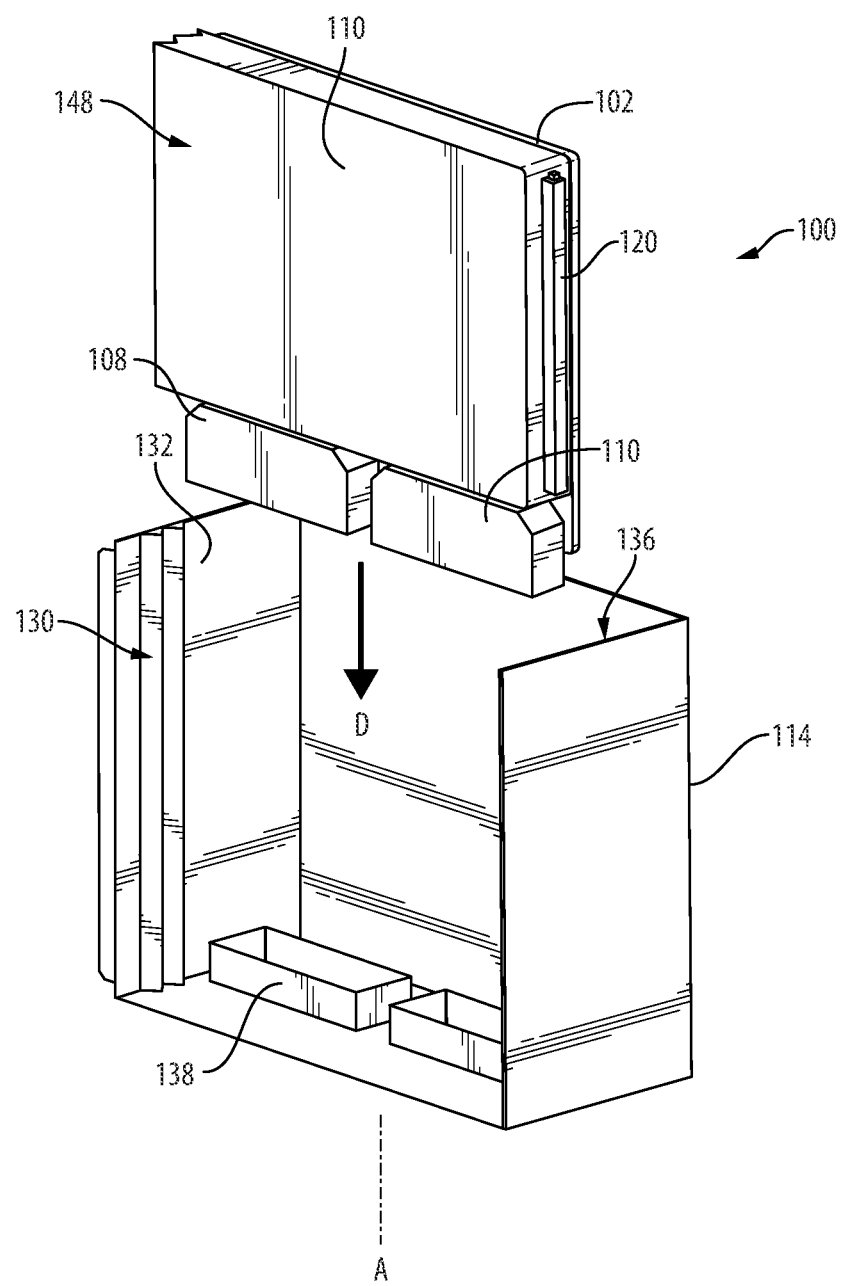
FIG. 2 is an exploded perspective view of the assembly of FIG. 1, showing the card or module with the CCA, connectors, and heatsink being inserted into the chassis.
Figure 3:
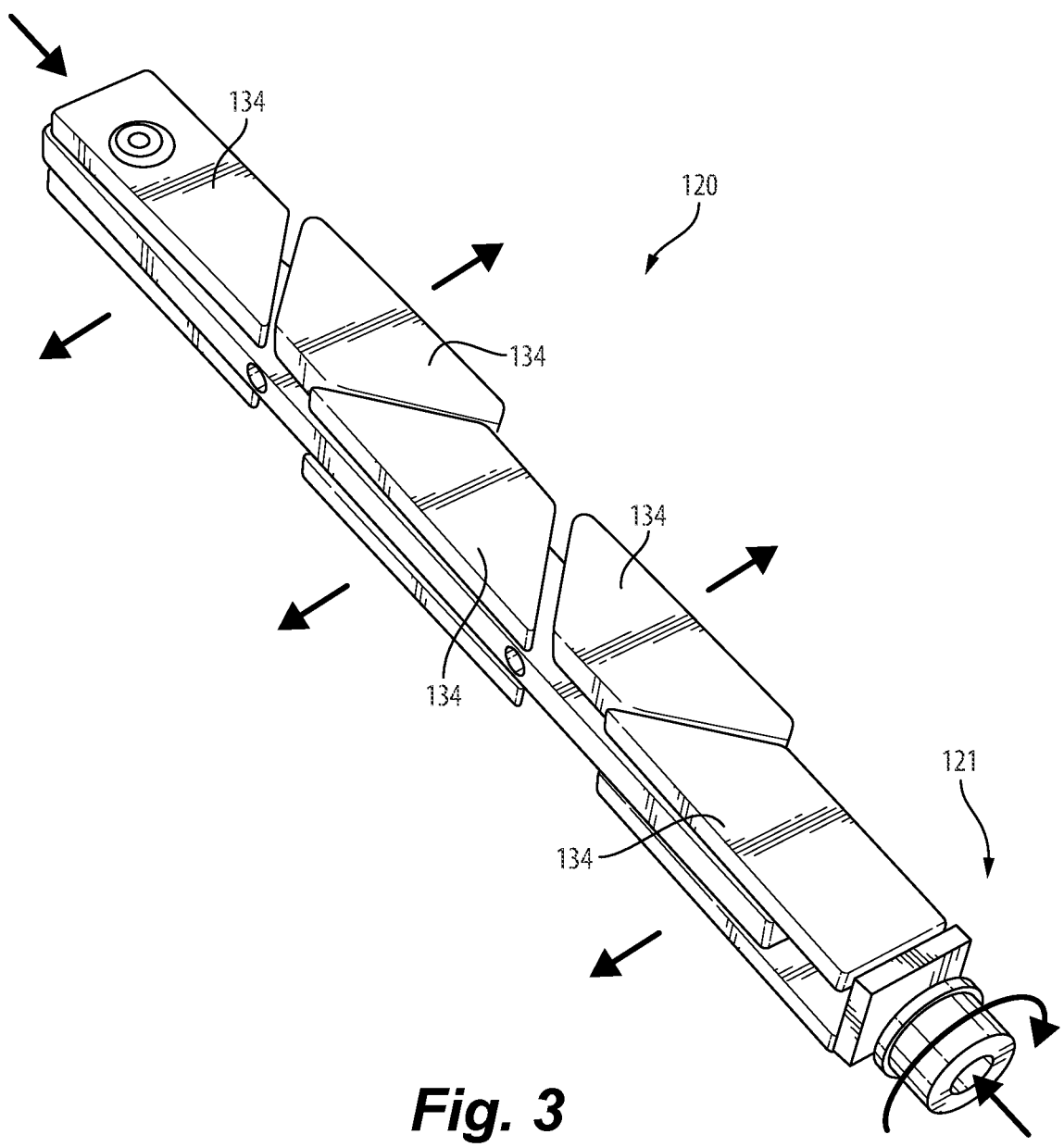
FIG. 3 is a perspective view of the wedge lock of the assembly of FIG. 1, showing the wedge lock in the expanded state.

The assembly 100 can include a chassis 114, a portion of which is shown in FIG. 2. A rail feature 130 is defined on an inward facing surface 132 of the chassis 114. The connectors 108, 112 can be connected to a corresponding electrical interface 138 in the chassis 114 by inserting the CCA/heat sink module 102/110 into the chassis 114 in the direction D along the insertion axis A. In doing so, the undulating channel feature 116 is engaged with the rail feature 130 to house the CCA 102 and heatsink 110 within the chassis 114. The undulating channel feature 116 and rail feature 130 are configured to guide the connectors 108, 112 to connect with the electrical interface 138 of the chassis 115 as the CCA 102 is inserted into the chassis 114. The connectors 108, 112, electrical interface 138, wedge feature 116, rail feature 130, 134, and wedge lock 120 are configured to retain the card or assembly 148 of the CCA 102 in place within the chassis 114. As shown in FIG. 3, the wedge lock 120 can be expanded by twisting the worm gear 121, which expands the segments 134 laterally as the length of the wedge lock 120 is shortened, as indicated by the motion arrows in FIG. 3.

With reference now to FIG. 4, the chassis 114 includes an inward facing wedge lock surface 136 opposite the rail feature 130. The wedge lock 120 can be compressed against the wedge lock surface 136 of the chassis 114 by actuating the wedge lock 120 to expand as shown in FIG. 3 after insertion of the CCA assembly 100 into the chassis. The connectors 106, 112, electrical interface 138, undulating channel feature 116, rail feature 130, and wedge lock 120 are configured to retain the CCA 102 in place within the chassis 114. Optionally, heat sink fins 134 can be defined on an outside surface of the chassis 114 proximate the rail feature 130, in thermal communication with the rail feature 130 for conducting heat away from the rail feature 130. The flow of heat from the heat sink 110 to the interface of the undulating channel feature 116 and rail feature 130 is indicated by the heat flow arrows in FIG. 4.

Referring to FIG. 5, the wedge surfaces 126, 128 (also labeled in FIG. 1) of the wedge feature 116 are engaged in direct thermal contact with corresponding surfaces 140, 142 of the rail feature 130 for sinking heat from the heat generating electronic components 104 (labeled in FIG. 1), through the heat sink 110, into the chassis 114, and away from the exterior surfaces of the chassis 114.

Referring again to FIG. 4, the CCA 102 occupies a first bay 144 of the chassis 114. The chassis 114 can include any suitable number of additional bays, e.g. at the positions indicated by reference characters 146 in FIG. 4, which can include traditional wedge locks configured for retaining a wedge locking CCAs in the chassis 114, and/or a rail features 130 as disclosed herein configured for retaining a second CCA 102 with corresponding undulating channel features 116. The module or card 148 of the CCA 102, heat sink 110, and connectors 108, 112 can be configured to comply with the module envelope specifications for 3U, 6U, 9U, VITA, or any other suitable envelope. The bays 144, 146 of the chassis 114 can correspondingly be configured to receive CCA's complying with 3U, 6U, 9U, or VITA, or any other suitable envelope specifications.

Systems and methods as disclosed herein can provide potential benefits such as the following. In terms of technical performance relative to traditional systems, they can provide increased contact surface area at module/rail interface for improved thermal management. They can allow for placement of high dissipating components onto one side of a CCA module, e.g. with reference to FIG. 1, the hottest running components 104 can be positioned on the CCA 102 closest to the undulating channel feature 116. They can provide self-alignment of a CCA module within rail features, e.g. rail features 130. Systems as disclosed herein can be applied across multiple adjacent modules in a single end assembly. In terms of cost, weight and complexity, systems and methods as disclosed herein can reduce/eliminate the number of part numbers/assembly steps since less wedgelocks are used than in other systems. The systems and methods as disclosed herein can reduce weight in scenarios where less heatsink or fin material is required for internal/external thermal management, and can reduce component costs when lower thermal ratings are needed.

The methods and systems of the present disclosure, as described above and shown in the drawings, provide for improved heat sinking from heat generating components of circuit card assemblies (CCAs) relative to conventional wedge locks. While the apparatus and methods of the subject disclosure have been shown and described with reference to preferred embodiments, those skilled in the art will readily appreciate that changes and/or modifications may be made thereto without departing from the scope of the subject disclosure.

What is claimed is:
1. An electronic module assembly comprising:
a circuit card assembly (CCA) including heat generating electronic components;

a connector electrically connected to the heat generating electronic components, wherein the connector is positioned at a connection end of the CCA;

a heatsink mounted to the CCA and connected in thermal communication with the electronic components, wherein an undulating channel feature is defined along a lateral edge of the heatsink relative to the connector, wherein one or more channels of the undulating channel feature are aligned with an insertion axis defined by the connector; and a chassis, wherein a rail feature is defined on an inward facing surface of the chassis, and wherein the connector is connected to a corresponding electrical interface in the chassis with the undulating channel feature engaged with the rail feature to house the CCA and the heatsink within the chassis, wherein the lateral edge is a first lateral edge of the heatsink, wherein the heatsink includes a wedge lock extending along a second lateral edge of the heatsink opposite the undulating channel feature, wherein the chassis includes a wedge lock surface of the chassis on a first side of the chassis opposite from a second side of the chassis where the rail feature is located, and wherein the wedge lock is compressed against the wedge lock surface of the chassis in a direction toward the rail feature.

2. The assembly as recited in claim 1, wherein the one or more channels of the undulating channel feature include at least two channels.

3. The assembly as recited in claim 1, wherein the heatsink includes the wedge lock extending along the second lateral edge of the heatsink opposite the undulating channel feature.

4. The assembly as recited in claim 1, wherein the first lateral edge of the heat sink has a full length, wherein the undulating channel feature extends along the full length of the first lateral edge of the heatsink.

5. The assembly as recited in claim 1, wherein each channel of the one or more channels of the undulating channel feature is defined between two wedge surfaces, wherein each wedge surface is parallel relative to the insertion axis.

6. The assembly as recited in claim 1 wherein each channel of the one or more channels of the undulating channel feature is defined between two wedge surfaces, wherein each wedge surface is oblique relative to a plane defined by the CCA.

7. The assembly as recited in claim 1, wherein opposed wedge surfaces of the undulating channel feature are engaged in thermal contact with corresponding surfaces of the rail feature for sinking heat from the heat generating electronic components to the chassis.

8. The assembly as recited in claim 7, wherein the undulating channel feature and the rail feature are configured to guide the connector to connect with the electrical interface of the chassis as the CCA is inserted into the chassis.

9. The assembly as recited in claim 8, wherein the connector, the electrical interface, the undulating channel feature, the rail feature, and the wedge lock are configured to retain the CCA in place within the chassis.

10. The assembly as recited in claim 1, wherein the CCA is a first CCA and occupies a first bay of the chassis, wherein the chassis includes a second bay with wedge locks configured for retaining a second CCA in the chassis.

11. The assembly as recited in claim 1, wherein the undulating channel feature is a first undulating channel feature, wherein the CCA occupies a first bay of the chassis, wherein the chassis includes a second bay with a second rail feature configured for retaining a second CCA with a second undulating channel feature.

12. The assembly as recited in claim 1, wherein the CCA occupies a bay of the chassis that is configured to receive CCA modules complying with one of 3U, 6U, 9U, and VITA-compliant module envelopes.

13. The assembly as recited in claim 1, wherein heat sink fins are defined on an outside surface of the chassis in thermal communication with the rail feature for conducting heat away from the rail feature.

14. The assembly as recited in claim 1, wherein the connector is a first connector and further comprising at least one additional connector aligned with the first connector for connecting independent functions of the CCA to another electrical interface of the chassis.

* * * * *